US008675437B2

(12) United States Patent
Sato

(10) Patent No.: US 8,675,437 B2
(45) Date of Patent: Mar. 18, 2014

(54) SEMICONDUCTOR MEMORY DEVICE

(76) Inventor: Tomohiko Sato, Tokyo (JP)

(*) Notice: Subject to any disclaimer, the term of this patent is extended or adjusted under 35 U.S.C. 154(b) by 68 days.

(21) Appl. No.: 12/883,976

(22) Filed: Sep. 16, 2010

(65) Prior Publication Data

US 2011/0069573 A1    Mar. 24, 2011

(30) Foreign Application Priority Data

Sep. 18, 2009  (JP) ................. 2009-217405

(51) Int. Cl.
*G11C 7/00*         (2006.01)
(52) U.S. Cl.
USPC ........................................... 365/222
(58) Field of Classification Search
USPC ........................................... 365/222
See application file for complete search history.

(56) References Cited

U.S. PATENT DOCUMENTS

| | | | | |
|---|---|---|---|---|
| 5,247,643 | A * | 9/1993 | Shottan | 711/143 |
| 5,729,709 | A * | 3/1998 | Harness | 395/405 |
| 5,963,467 | A * | 10/1999 | Miyatake et al. | 365/149 |
| 6,275,895 | B1 * | 8/2001 | Tabo | 711/106 |
| 6,847,575 | B2 * | 1/2005 | Ayukawa et al. | 365/230.03 |
| 7,760,572 | B2 * | 7/2010 | Koshita | 365/222 |
| 2007/0047367 | A1 * | 3/2007 | Kim et al. | 365/230.03 |

FOREIGN PATENT DOCUMENTS

| | | |
|---|---|---|
| JP | 04-209392 A | 7/1992 |
| JP | 04-243089 A | 8/1992 |
| JP | 05-074152 A | 3/1993 |
| JP | 09-204774 A | 8/1997 |
| JP | 09-289293 A | 11/1997 |
| JP | 10-289570 A | 10/1998 |
| JP | 2000-195252 A | 7/2000 |
| JP | 2001-035152 A | 2/2001 |
| JP | 2002-366944 A | 12/2002 |
| JP | 2005-158158 A | 6/2005 |
| JP | 2008-135113 A | 6/2008 |
| JP | 2008-146781 A | 6/2008 |

* cited by examiner

*Primary Examiner* — Hoai V Ho
*Assistant Examiner* — Pablo Huerta
(74) *Attorney, Agent, or Firm* — Sughrue Mion, PLLC

(57) ABSTRACT

A semiconductor device includes a plurality of bank sets and an address controller. Each bank set includes a plurality of banks. Each bank includes a plurality of memory mats and sense amplifier arrays corresponding to row addresses. The plurality of bank sets is arranged in both sides of arrays of power electrode pads to be used for operations of the sense amplifier arrays. The plurality of bank sets commonly shares the arrays of power electrode pads. The address controller generates different row addresses that are supplied to different ones of the plurality of bank sets. The different row addresses designate different memory mats in the different ones of the plurality of bank sets, so as to designate different arrays of the power electrode pads for the different ones of the plurality of bank sets for refresh operation in accordance with an external refresh command.

10 Claims, 10 Drawing Sheets

SEMICONDUCTOR MEMORY DEVICE

BACKGROUND OF THE INVENTION

1. Field of the Invention

The present invention relates to a semiconductor memory device, and more particularly, to a semiconductor memory device capable of optimally selecting an activated word line address when a refresh command is input.

Priority is claimed on Japanese Patent Application No. 2009-217405, filed Sep. 18, 2009, the content of which is incorporated herein by reference.

2. Description of the Related Art

In a dynamic random access memory (DRAM) that stores data by accumulating charges in a capacitor, the charges accumulated in the capacitor leak over time, such that data cannot be detected. Accordingly, it is necessary to perform a refresh operation periodically. This refresh operation is performed by activating word lines of the DRAM, reading data from memory cells connected to the activated word lines to bit lines, amplifying a voltage difference between a pair of bit lines using a sense amplifier, and then rewriting data to the memory cells via the bit lines.

In a dynamic random access memory (DRAM) that stores data by accumulating charges in a capacitor, the charges accumulated in the capacitor leak over time, such that data cannot be detected. Accordingly, it is necessary to perform a refresh operation periodically. This refresh operation is performed by activating word lines of the DRAM, reading data from memory cells connected to the activated word lines to bit lines, amplifying a voltage difference between a pair of bit lines using a sense amplifier, and then rewriting data to the memory cells via the bit lines.

For example, in the refresh operation of a 1-gigabit (Gbit) DRAM, when an external refresh command is input once, 16k memory cells in each of eight banks are refreshed. Here, the bank refers to one unit for an independent operation, such as a read operation or a write operation. The bank includes a plurality of memory mats each having a plurality of memory cells provided at intersections between a plurality of word lines and a plurality of bit lines. Each bank performs an operation according to an input command, but in a refresh operation, eight banks are simultaneously selected and a total of 128k memory cells are refreshed.

SUMMARY

In one embodiment, a semiconductor device may include, but is not limited to, a plurality of bank sets and an address controller. Each bank set may include, but is not limited to, a plurality of banks Each bank may include, but is not limited to, a plurality of memory mats and sense amplifier arrays corresponding to row addresses. The plurality of bank sets is arranged in both sides of arrays of power electrode pads to be used for operations of the sense amplifier arrays. The plurality of bank sets commonly shares the arrays of power electrode pads. The address controller generates different row addresses that are supplied to different ones of the plurality of bank sets. The different row addresses designate different memory mats in the different ones of the plurality of bank sets, so as to designate different arrays of the power electrode pads for the different ones of the plurality of bank sets for refresh operation in accordance with an external refresh command.

In another embodiment, a semiconductor device may include, but is not limited to, a plurality of banks, an array of electrode pads, and a controller. The plurality of banks extends over first and second regions. The plurality of banks may include, but is not limited to, a first set of banks and a second set of banks The array of electrode pads may include, but is not limited to, a first set of electrode pads and a second set of electrode pads. The controller activates, for refresh operation, a first plurality of word lines being in the first region and belonging to the first set of banks The controller activates a second plurality of word lines being in the second region and belonging to the second set of banks The controller couples the first set of banks to the first set of electrode pads for refresh operation. The controller couples the second set of banks to the second set of electrode pads for refresh operation.

In still another embodiment, a semiconductor device may include, but is not limited to, first and second bank sets and an address controller. Each of the first and second bank sets may include, but is not limited to, a plurality of banks, each bank comprising a plurality of memory mats and sense amplifier arrays corresponding to row addresses. The first bank set is arranged in a first side of a first array of power electrode pads. The second bank set is arranged in a second side of the first array of power electrode pads. The first and second bank sets commonly shares the first array of power electrode pads. The address controller generates first and second row addresses for the first and second bank sets respectively. The first row address designates a first memory mat of the first bank set. The second row address designates a second memory mat of the second bank set, so as to designate different power electrode pads of the first array of power electrode pads for the first and second bank sets in refresh operation in accordance with an external refresh command.

BRIEF DESCRIPTION OF THE DRAWINGS

The above features and advantages of the embodiments of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 7, 8 and 9, in order to facilitate the understanding of the present invention.

Figure 7:
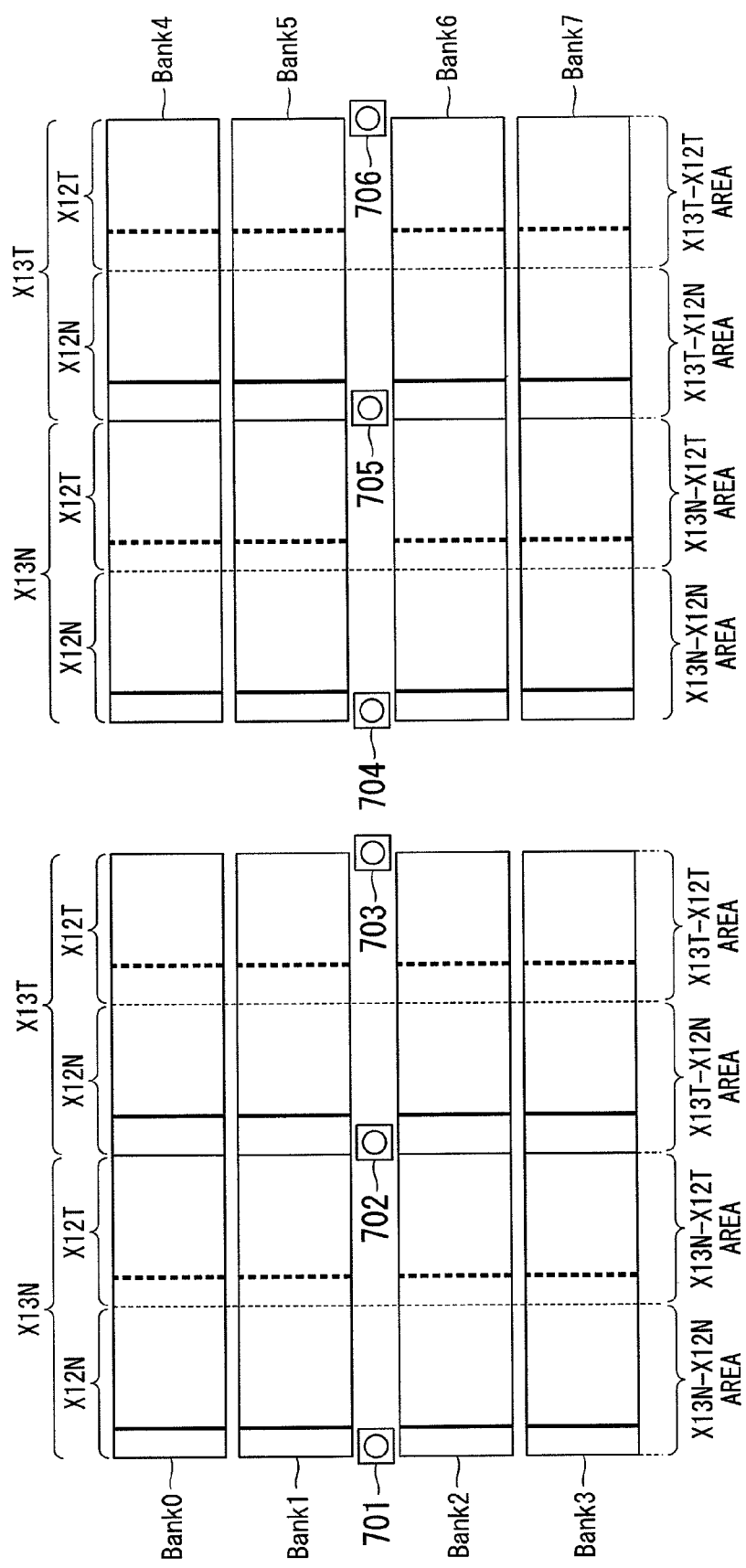
FIG. 7 is a schematic view illustrating another layout of banks in the DRAM in the related art.

FIG. 7 is a conceptual diagram showing the layout of banks in a 1-Gbit DRAM of the related art. Word lines selected in a refresh operation are indicated by solid lines and dotted lines. FIG. 8 is a conceptual diagram showing the layout of a sense amplifier and a memory mat in FIG. 7, and FIG. 9 is a timing chart showing control of word line selection in FIG. 7 on a time axis.

In FIG. 7, word lines in each bank are activated by an X decoder and a word driver (i.e., a word line selection circuit), which are not shown. The X decoder receives X address signals X0T to X13T and their logically inverted signals X0N to X13N, and activates the word lines according to logic levels of the signals.

That is, a word line determined by the logic level of the 14-bit X address signal is activated. Hereinafter, the X address signal input to the X decoder is denoted by Xi (i=0 to 13) without T/B. When a logic level of the X address Xi is "0," a logic level of an X address signal XiT becomes "0" and a logic level of an address signal XiN becomes "1." When the logic level of the X address Xi is"1," the logic level of the address signal XiT becomes"1" and the logic level of the address signal XiN becomes "0."

Each bank in FIG. 7 is divided into four areas (each including a plurality of memory mats) according to a logic level of the X address signal X13 and a logic level of the X address signal X12. First, the bank is divided into two areas according to the logic level of the primary X address signal X13. That is, the bank is divided into an area in which one word line is activated according to logic levels of X address signals X0-X12 when the logic level of the X address signal X13 is 0 (defined as an X13N area), and an area in which one word line is activated according to the logic levels of the X address signal X0-X12 when the logic level of the X address signal X13 is 1 (defined as an X13T area). Each of the X13N area and the X13T area is additionally divided into two areas according to the logic level of the X address signal X12. That is, each area is divided into an area in which one word line is activated according to the logic level of the X address signals X0-X11 when the logic level of the X address signal X12 is 0 (defined as an X12N area), and an area in which one word line is activated according to the logic level of the X address signals X0-X11 when the logic level of the X address signal X12 is 1 (defined as an X12T area). Hereinafter, the divided areas in FIG. 7 are defined as an X13N-X12N area, an X13N-X12T area, an X13T-X12N area, and an X13T-X12T area.

In FIG. 7, 16k word lines are provided in each bank. Among the word lines, word lines corresponding to the logic levels of the X address signals X0 to X12 all being 1 are activated in one refresh operation (a refresh operation in a refresh cycle tRFC). That is, two word lines corresponding to one of 213 (=8k) combinations of the logic levels of the X address signals X0 to X12 are activated irrespective of the logic level of the X address signal X13.

That is, two word lines in the X12N area (one in the X13N-X12N area and one in the X13T-X12N area) are activated or two word lines in the X12T area (one in the X13N-X12T area and one in the X13T-X12T area) are activated. In the refresh operation, a refresh cycle, in which 16k memory cells in each bank are refreshed, is repeated 8k times while changing the logic levels of the X address signals X0 to X12 to refresh all memory cells.

The word lines activated when the logic levels of the X address signals X0 to X12 are changed are alternately selected between the X12N area and the X12T area. That is, when the X address signal X12 is used as the least significant address in the refresh operation, two word lines in the X12N area are activated in a refresh cycle, and two word lines in the X12T area are activated in a next refresh cycle. In FIG. 7, word lines activated in the first refresh cycle are indicated by solid lines as "first REF activation sites," and word lines activated in the second refresh cycle are indicated by dotted lines as "second REF activation sites."

Figure 8:
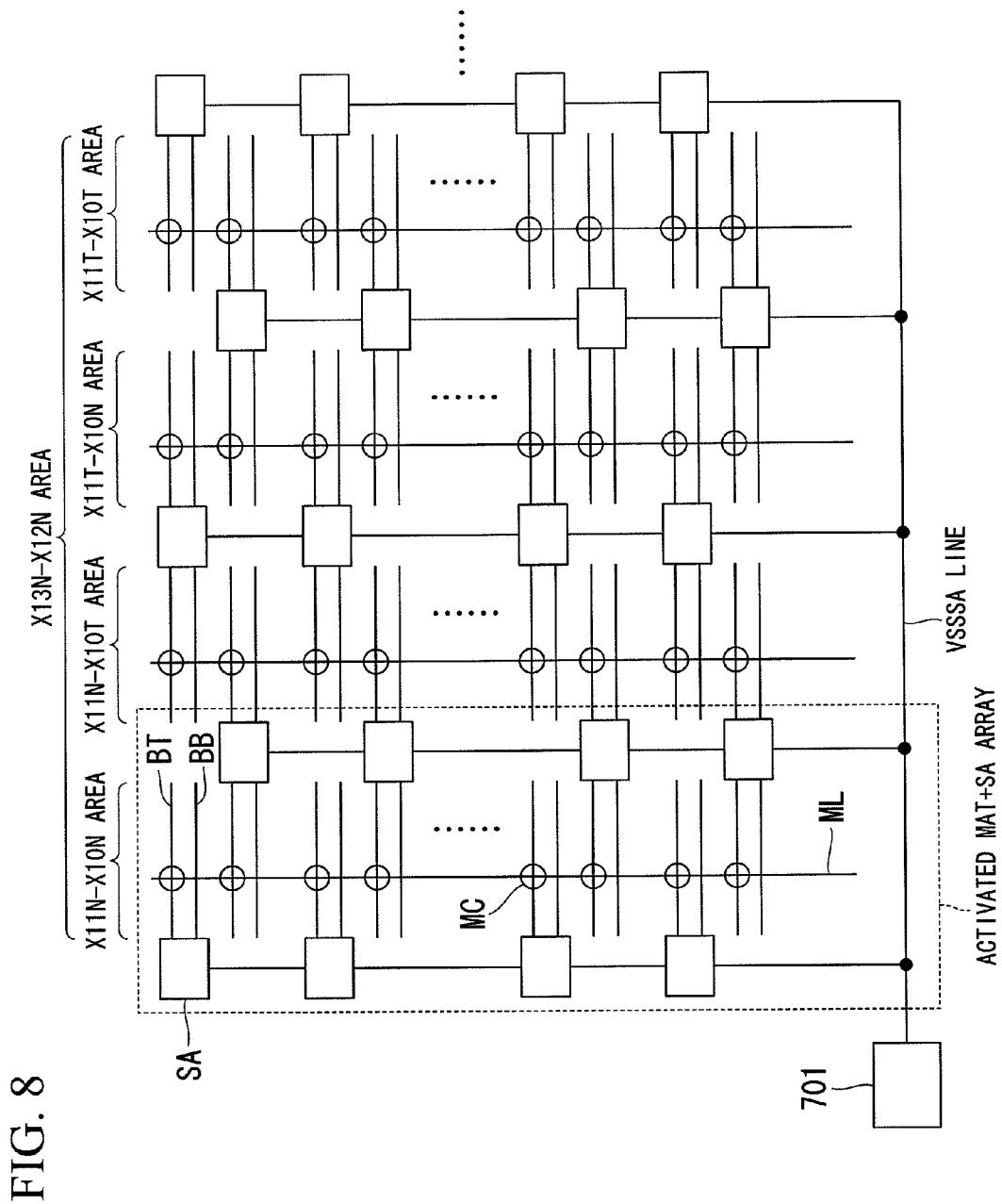
FIG. 8 is a diagram illustrating a configuration of a part of the layout of banks in the related art.

FIG. 8 is a schematic conceptual diagram showing the layout of the X13N-X12N areas in Bank0 and Bank1 shown in FIG. 7. In FIG. 8, a memory mat is shown which includes a plurality of word lines WL and a plurality of bit line pairs (of a bit line BT and a bit line BB), and a plurality of memory cells MC provided at intersections between the bit lines and the word lines. A plurality of (four) memory mats are arranged to form Bank0 and Bank1 in FIG. 7.

In FIG. 8, the X13N-X12N area is divided into an X11N-X10N area, an X11N-X10T area, an X11T-X10N area, and an X11T-X10T area according to the logic levels of the X address signal X10 and the X address signal X11.

When one word line in the X13N-X12N area is activated in the refresh operation as described above, it is assumed that a word line in the X11N-X10N area in FIG. 8 is activated. In the refresh operation, a voltage difference is generated between the pair of bit lines of an "activated MAT+SA array" indicated by a dotted line in FIG. 8 and amplified by sense amplifiers SA provided at left and right sides in a box indicated by the dotted line. When the voltage difference between the pair of bit lines is amplified by the sense amplifiers SA, operating current for amplification operation (defined as "sense current") flows to a VSSSA pad (electrode pad) 701 through a VSSSA line in FIG. 8.

Since the 16k memory cells in each bank are refreshed in the refresh operation as described above, the 16k memory cells in Bank0 and Bank1 are refreshed in the "activated MAT+SA array" shown in FIG. 8, and 16k sense amplifiers SA operate. Also, sense currents of Bank2 and Bank3 flow to the VSSSA pad 701, as shown in FIG. 7. That is, sense currents from a total of 32k sense amplifiers flow to the VSSSA pad 701.

Similarly, in FIG. 7, sense current from an "activated MAT+SA array" of the X13T-X12N area in Bank0 to Bank3 flows to a VSSSA pad 702. Further, sense current from an "activated MAT+SA array" in the X13N-X12N area in Bank4 to Bank7 flows to a VSSSA pad 704, and sense current from an "activated MAT+SA array" of the X13T-X12N area in Bank4 to Bank7 flows to a VSSSA pad 705.

When the sense current from the "activated MAT+SA array" of each bank is concentrated on a specific pad (e.g., the VSSSA pad 701) as described above, a potential of the VSSSA line connected to each VSSSA pad rises in the refresh operation, which affects operational margin and amplification speed of the sense amplifiers.

In the bank configuration shown in FIG. 7, such effects are suppressed using a refresh control method in which activation timing of each bank (word line and sense amplifier activation timing) is delayed. FIG. 9 is a timing chart showing an activation control method of the related art. In FIG. 9, bank delay when the word lines in the X12N area are activated in the first refresh cycle illustrated in FIG. 7 and when the word lines in the X12T area are activated in the second refresh cycle is shown.

Figure 9:
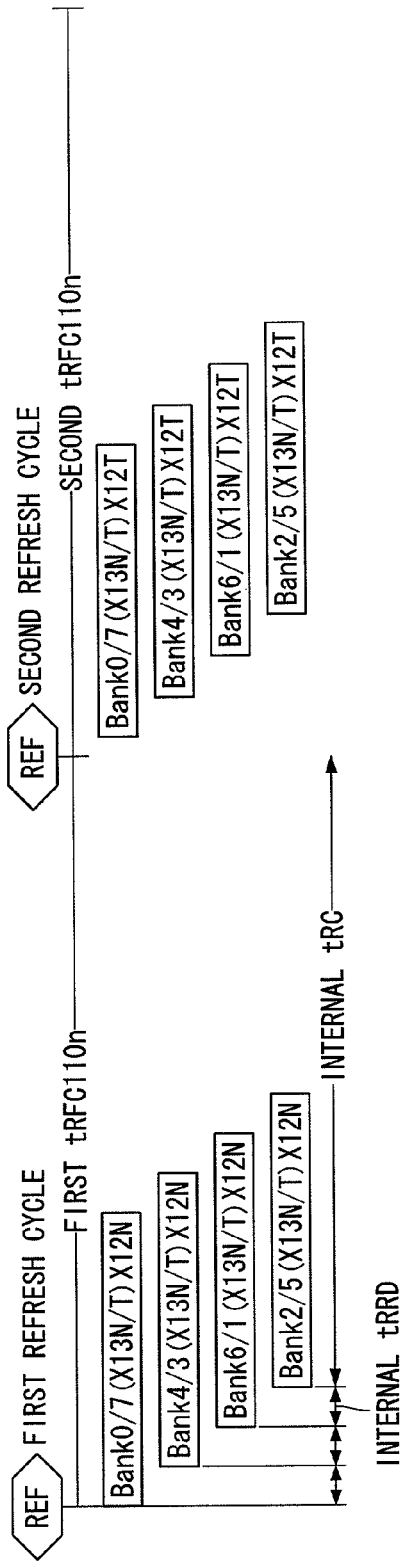
FIG. 9 is a timing chart illustrating a method of controlling refresh operations of the DRAM in the related art.

In FIG. 9, refresh cycle time (tRFC) indicates a time of a refresh cycle. For example, tRFC is defined as 110 nanoseconds (ns) in a specification of a product. The internal ROW-to-ROW delay time (tRRD) is a delay time between bank activation times. Internal tRRD is set in a memory device. Internal row cycle time (tRC) is a time from a word line activation time to a time when memory cell refresh is terminated and a potential of the memory cell is restored to a ground potential (equal to VSSSA) or a power supply voltage (VDDDSA). The internal tRC is set in the memory device.

As shown in FIG. 9, two banks are combined into one, and four obtained combinations are controlled to be delayed using the internal tRRD, instead of delaying eight banks using the internal tRRD in order. This is because a restore level of the memory cell is guaranteed and a tRFC standard is satisfied.

The reason for the combinations of the two banks, such as Bank0 and Bank7, Bank3 and Bank4, Bank1 and Bank6, and Bank2 and Bank5, and of activation of the combinations in this order is that VSSSA pads of the simultaneously activated banks are made different and the banks arranged at the same side with respect to the VSSSA pad are not continuously activated.

That is, as shown in FIG. 7, in the first refresh, sense currents from the "activated MAT+SA arrays" of Bank0 and Bank7 flow to the VSSSA pads 701 and 702 and the VSSSA pads 704 and 705, respectively. Even though both banks are simultaneously activated, the VSSSA pads differ. Similarly, sense currents from the "activated MAT+SA arrays" of Bank3 and Bank4, Bank1 and Bank6, and Bank2 and Bank5, which are simultaneously activated, flow to different VSSSA pads.

Further, Bank0 and Bank1 arranged at the same side with respect to the VSSSA pad are activated at twice the internal tRRD rather than continuously. Similarly, Bank2 and Bank3, Bank4 and Bank5, and Bank6 and Bank7 are activated at twice the internal tRRD.

Japanese Patent Laid-open Publications Nos. 2008-135113 and 2008-146781 disclose the semiconductor memory devices described above as the related art.

As described above, in the semiconductor memory device of the related art, current concentration on one VSSSA pad is distributed through delay of bank activation timing, thereby suppressing the rise of the potential of a VSSSA line connected to the VSSSA pad and mitigating effects on operational margin and amplification speed of the sense amplifiers.

However, a delay width (internal tRRD) of bank activation timing and internal tRC are limited to the tRFC standard. Therefore, when the delay width is small, a current distribution effect is reduced and the operational margin of the sense amplifier is degraded, and the amplification speed becomes low. Conversely, when the delay width is great, internal tRC of subsequently activated banks is reduced, causing the restore level of the memory cell not to reach a sufficient voltage.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a plurality of bank sets and an address controller. Each bank set may include, but is not limited to, a plurality of banks Each bank may include, but is not limited to, a plurality of memory mats and sense amplifier arrays corresponding to row addresses. The plurality of bank sets is arranged in both sides of arrays of power electrode pads to be used for operations of the sense amplifier arrays. The plurality of bank sets commonly shares the arrays of power electrode pads. The address controller generates different row addresses that are supplied to different ones of the plurality of bank sets. The different row addresses designate different memory mats in the different ones of the plurality of bank sets, so as to designate different arrays of the power electrode pads for the different ones of the plurality of bank sets for refresh operation in accordance with an external refresh command.

In some cases, the plurality of memory mats and sense amplifier arrays correspond to the least significant addresses in refresh operation. The address controller logically inverts the least significant address for one of the plurality of bank sets for refresh operation.

In some cases, activations for refresh operation of the plurality of banks are performed at different timings, the plurality of banks are included in the bank set and are coupled to the same array of power electrode pads.

In some cases, the plurality of bank sets may include, but is not limited to, first, second, third and fourth bank sets. The first and second bank sets commonly share a first one of the arrays of power electrode pads. The third and fourth bank sets commonly share a second one of the arrays of power electrode pads.

In some cases, the first bank set may include, but is not limited to, a first bank and a second bank. The second bank set may include, but is not limited to, a third bank and a fourth bank. The third bank set may include, but is not limited to, a fifth bank and a sixth bank. The fourth bank set may include, but is not limited to, a seventh bank and an eighth bank.

In some cases, the refresh operation may be performed in the order of refreshing the first and eighth banks in a first refreshing process, refreshing the fourth and fifth banks in a second refreshing process, refreshing the second and seventh banks in a third refreshing process, and refreshing the third and sixth banks in a fourth refreshing process.

In some cases, the refresh operation may be performed in the order of refreshing the first, fourth, fifth and eighth banks in a first refreshing process, and refreshing the second, third, sixth and seventh banks in a second refreshing process.

In another embodiment, a semiconductor device may include, but is not limited to, a plurality of banks, an array of electrode pads, and a controller. The plurality of banks extends over first and second regions. The plurality of banks may include, but is not limited to, a first set of banks and a second set of banks. The array of electrode pads may include, but is not limited to, a first set of electrode pads and a second set of electrode pads. The controller activates, for refresh operation, a first plurality of word lines being in the first region and belonging to the first set of banks The controller activates a second plurality of word lines being in the second region and belonging to the second set of banks The controller couples the first set of banks to the first set of electrode pads for refresh operation. The controller couples the second set of banks to the second set of electrode pads for refresh operation.

In some cases, the first set of banks is provided in a first side of the array of electrode pads and the second set of banks is provided in a second side of the array of electrode pads.

In some cases, the electrode pads belonging to the first set of electrode pads and the electrode pads belonging to the second set of electrode pads are aligned alternately.

In some cases, the plurality of banks may include, but is not limited to, first to eighth banks The first set of banks may include, but is not limited to, the first, second, seventh and eighth banks The second set of banks may include, but is not limited to, the third, fourth, fifth and sixth banks The array of electrode pads may include, but is not limited to, an array of first to eighth electrode pads aligned in this order. The first set of electrode pads may include, but is not limited to, the first, third, fifth and seventh electrode pads, the second set of electrode pads may include, but is not limited to, the second, fourth, sixth and eighth electrode pads. The controller activates, for refresh operation, the first plurality of word lines being in the first region and belonging to the first, second, seventh and eighth banks The controller activates the second plurality of word lines being in the second region and belonging to the third, fourth, fifth and sixth banks The controller couples the first, second, seventh and eighth banks to the first, third, fifth and seventh electrode pads respectively for refresh operation. The controller couples the third, fourth, fifth and sixth banks to the second, fourth, sixth and eighth electrode pads respectively for refresh operation.

In some cases, the refresh operation may be performed in the order of refreshing the first and eighth banks in a first refreshing process, refreshing the fourth and fifth banks in a second refreshing process, refreshing the second and seventh banks in a third refreshing process, and refreshing the third and sixth banks in a fourth refreshing process.

In still another embodiment, a semiconductor device may include, but is not limited to, first and second bank sets and an address controller. Each of the first and second bank sets may include, but is not limited to, a plurality of banks, each bank comprising a plurality of memory mats and sense amplifier arrays corresponding to row addresses. The first bank set is arranged in a first side of a first array of power electrode pads. The second bank set is arranged in a second side of the first array of power electrode pads. The first and second bank sets commonly shares the first array of power electrode pads. The address controller generates first and second row addresses for the first and second bank sets respectively. The first row address designates a first memory mat of the first bank set. The second row address designates a second memory mat of the second bank set, so as to designate different power electrode pads of the first array of power electrode pads for the first and second bank sets in refresh operation in accordance with an external refresh command.

In some cases, the plurality of memory mats and sense amplifier arrays correspond to the least significant addresses in refresh operation and the address controller logically inverts the least significant address for one of the first and second bank sets for refresh operation.

In some cases, activations of the plurality of banks are performed at different timings, the plurality of banks are included in the same one of the first and second bank sets and are coupled to the same power electrode pads.

In some cases, the semiconductor device may include, but is not limited to, third and fourth bank sets. Each bank set may include, but is not limited to, a plurality of banks Each bank may include, but is not limited to, a plurality of memory mats and sense amplifier arrays corresponding to row addresses. The third bank set is arranged in the first side of a second array of power electrode pads. The fourth bank set is arranged in the second side of the second array of power electrode pads. The third and fourth bank sets commonly shares the second array of power electrode pads. The address controller generates third and fourth row addresses for the third and fourth bank sets respectively. The third row address designates a third memory mat of the third bank set. The fourth row address designates a fourth memory mat of the fourth bank set, so as to designate different power electrode pads of the second array of power electrode pads for the third and fourth bank sets in refresh operation in accordance with the external refresh command.

In some cases, the first and second bank sets commonly share the first array of power electrode pads. The third and fourth bank sets commonly share the second array of power electrode pads.

In some cases, the first bank set may include, but is not limited to, a first bank and a second bank. The second bank set may include, but is not limited to, a third bank and a fourth bank. The third bank set may include, but is not limited to, a fifth bank and a sixth bank. The fourth bank set may include, but is not limited to, a seventh bank and an eighth bank.

In some cases, the refresh operation is performed in the order of refreshing the first and eighth banks in a first refreshing process, refreshing the fourth and fifth banks in a second refreshing process, refreshing the second and seventh banks in a third refreshing process, and refreshing the third and sixth banks in a fourth refreshing process.

In some cases, the refresh operation is performed in the order of refreshing the first, fourth, fifth and eighth banks in a first refreshing process, and refreshing the second, third, sixth and seventh banks in a second refreshing process.

Hereinafter, preferred embodiments of the present invention will be described in detail with reference to the accompanying drawings.

Figure 1:
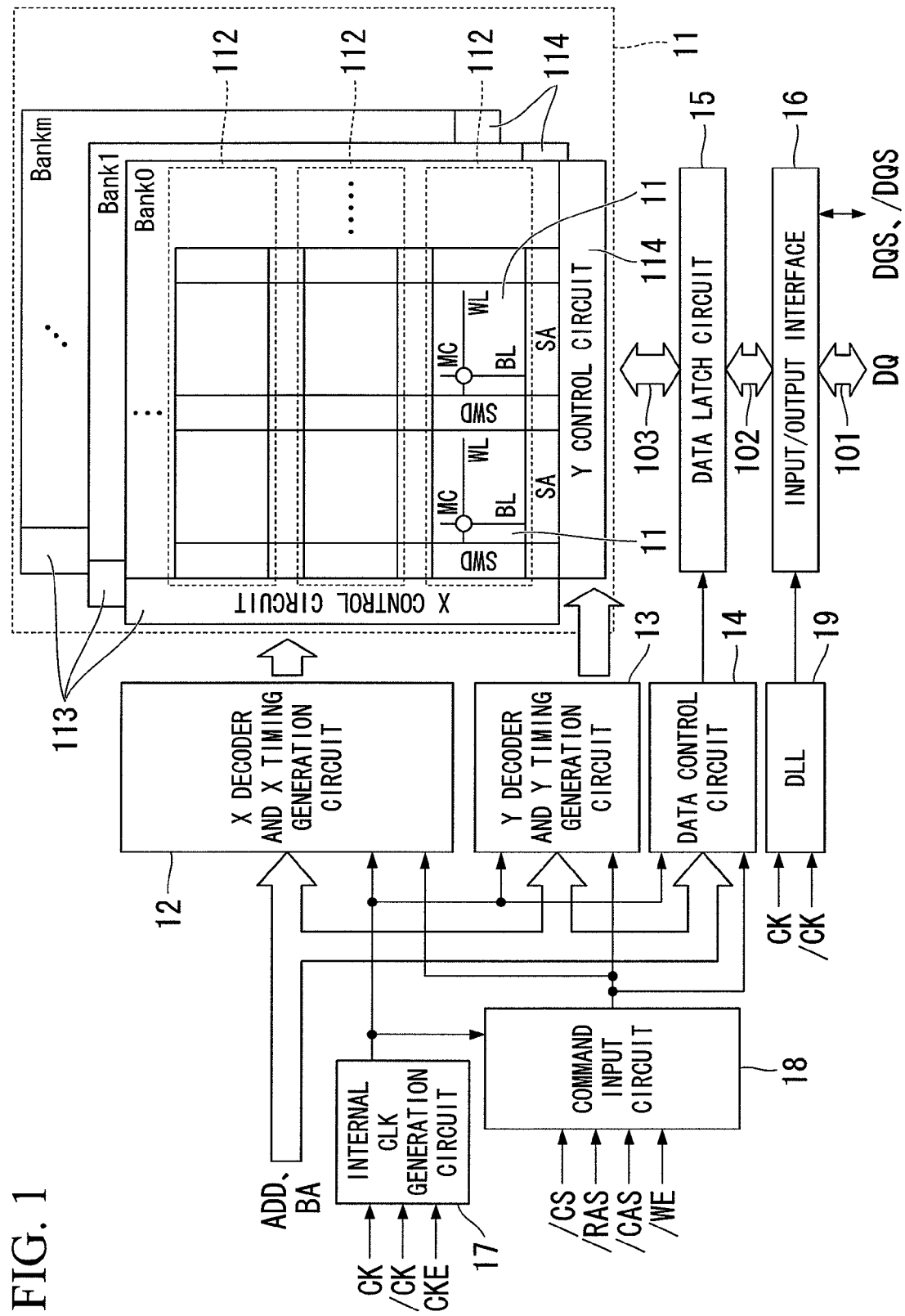
FIG. 1 is a block diagram illustrating the configuration of a DRAM in accordance with a first preferred embodiment of the present invention.

FIG. 1 is a block diagram showing an entire configuration of a DRAM to which the present invention is applied. The DRAM shown in FIG. 1 includes a memory array 11, an X decoder and X timing generation circuit 12, a Y decoder and Y timing generation circuit 13, a data control circuit 14, a data latch circuit 15, an input/output interface 16, an internal clock (CLK) generation circuit 17, a command input circuit 18, and a delay locked loop (DLL) circuit 19.

The memory array 11, the data latch circuit 15, and the input/output interface 16 are connected via data transfer buses 101 to 103, and data transfer is controlled by the data control circuit 14. Timing to output data, such as data input/output (DQ) and data strobe input/output (DQS, /DQS), to the outside is controlled by the DLL circuit 19.

The memory array 11 is controlled by the X decoder and X timing generation circuit 12 and the Y decoder and Y timing generation circuit 13, which are controlled by the command input circuit 18.

The memory array 11 shown in FIG. 1 includes m banks Each bank includes a plurality of memory mats 112 arranged in parallel with a plurality of word lines WL. Each memory mat includes a plurality of sub memory mats 111. Each sub memory mat includes a plurality of memory cells MC provided at intersections between the plurality of word lines WL and a plurality of bit lines BL. An X control circuit 113 and a Y control circuit 114 are disposed in each bank. Each sub memory mat 111 is surrounded by a sense amplifier area SA including a plurality of sense amplifiers used to amplify information read from the memory cell MC, and a sub word driver area SWD including a plurality of sub word driver circuits for driving the plurality of word lines WL.

The present embodiment will be described on the assumption that m=8 and the memory array includes Bank0 to Bank7. In the following description, the sub word driver SWD will be omitted and it is assumed that the memory cell MC connected to the word line WL in the memory mat 112 is selected by the X control circuit 113.

In FIG. 1, CK and /CK are clock inputs, CKE is a clock enable input, /CS is a chip select input, /RAS is a row address strobe input, /CAS is a column address strobe input, /WE is a write enable input, ADD is an address input, and BA is a bank address input. The DRAM shown in FIG. 1 receives commands, such as Read, Write and Ref, determined by a combination of logic levels of /CS, /RAS, /CAS and /WE input in synchronization with the clock inputs CK and /CK, and performs read, write, and refresh operations according to the input commands.

Figure 2:
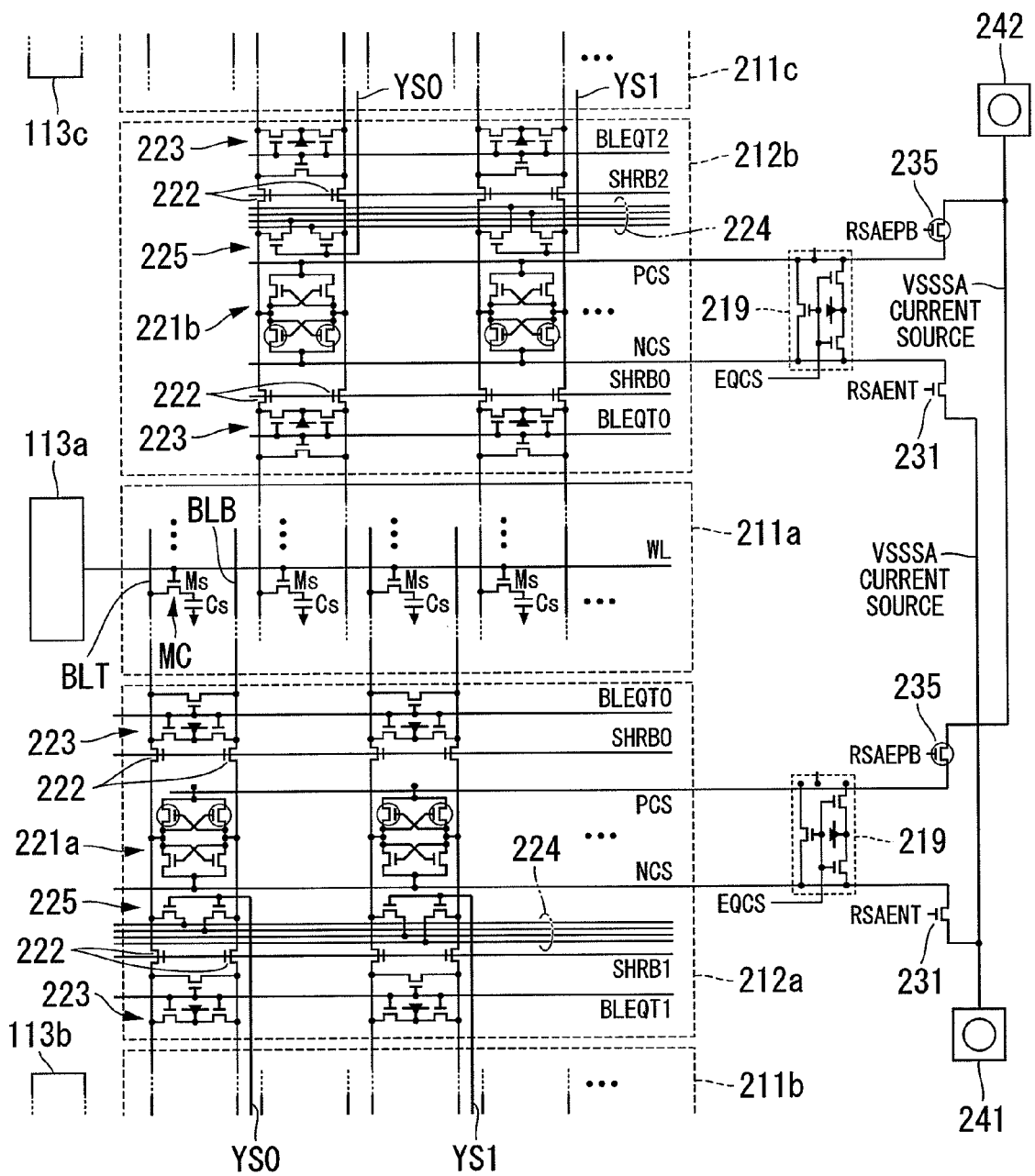
FIG. 2 is a circuit diagram illustrating sense amplifier circuits and control circuits included in the DRAM of FIG. 1.

FIG. 2 is a circuit diagram for explaining the relationship between sense amplifiers and bit lines in the memory mat 112 of FIG. 1. In FIG. 2, memory mats 211a, 211b, 211c and sense amplifier circuits 212a and 212b are shown.

The sense amplifier circuit 212a is a shared sense amplifier circuit used in common by the memory mat 211a and the memory mat 211b. The sense amplifier circuit 212b is a shared sense amplifier circuit used in common by the memory mat 211a and the memory mat 211c.

While the sense amplifier circuit 212a and the sense amplifier circuit 212b are disposed opposite to each other, with the memory mat 211a arranged therebetween, as described above, the sense amplifier circuit 212a and the sense amplifier circuit 212b may be disposed at the same side of one memory mat and shared with the memory mat 211b or the memory mat 211c. An open-type sense amplifier circuit in which a pair of bit lines BLT and BLB belong to the memory mat 211a and the memory mat 211b or the memory mat 211a and the memory mat 211c, respectively, may be used as a sense amplifier circuit.

Each of the memory mats 211a to 211c includes a plurality of memory cells provided at intersections between a plurality of word lines and a plurality of bit lines. One word line WL and four memory cells MC connected to the word line WL in the memory mat 211a are shown as representative ones in FIG. 2. The memory cell MC is provided at an intersection between each bit line BLT and the word line WL. The memory cell MC includes a selection transistor MS and an information storage capacitor CS. The selection transistor MS has a gate electrode connected to the word line WL. The selection transistor MS is selected by the X control circuit.

The X control circuit 113 in FIG. 1 is shown as X control circuits 113a to 113c in FIG. 2. The X control circuit is a circuit (word driver) for selecting one word line WL from among the plurality of word lines in the memory mat. In FIG. 2, the X control circuit 113a selects the word line in the memory mat 211a, the X control circuit 113b selects the word line in the memory mat 211b, and the X control circuit 113c selects the word line in the memory mat 211c.

Each of the sense amplifier circuit 212a and the sense amplifier circuit 212b includes a basic unit circuit, which includes a sense amplifier unit, a transfer unit, a balancer unit, and a Y switch unit. A plurality of basic unit circuits (4k basic unit circuits in the sense amplifier circuit 212a and 4k basic unit circuits in the sense amplifier circuit 212b) are arranged in parallel with the word line.

In FIG. 2, the sense amplifier unit includes two P channel MOS transistors and two N channel MOS transistors. The sense amplifier unit is shown as a sense amplifier unit 221a in the sense amplifier circuit 212a, and the sense amplifier unit is shown as a sense amplifier unit 221b in the sense amplifier circuit 212b.

Each transfer unit 222 includes a plurality of N channel MOS transistors. In the sense amplifier circuit 212a, the transfer units 222 connect or disconnect the sense amplifier unit 221a to or from the bit lines BLT and BLB in the memory mat 211a and the memory mat 211b. In the sense amplifier circuit 212b, the transfer units 222 connect or disconnect the sense amplifier unit 221b to or from the bit lines BLT and BLB in the memory mat 211a and the memory mat 211c.

A balancer unit 223 includes a plurality of N channel MOS transistors. The balancer unit 223 is a circuit for precharging the bit lines to a predetermined potential and equalizing a potential between the bit pairs when the DRAM is precharged. The balancer unit 223 is provided corresponding to each of the bit line pairs in the memory mats 211a to 211c.

A Y switch unit 225 includes a pair of N channel MOS transistors. The Y switch unit 225 is a circuit for transferring read information from the bit lines BLT and BLB to an IO line 224. The Y switch unit corresponds to the Y control circuit 114 in FIG. 1. The Y switch unit is controlled by Y selection signals YS0 and YS1 output by the Y decoder and Y timing generation circuit unit.

The plurality of sense amplifier units 221a in the sense amplifier circuit 212a and the plurality of sense amplifier units 221b in the sense amplifier circuit 212b use a common source power line connected to source terminals of P channel MOS transistors and a common source power line connected to source terminals of N channel MOS transistors. When a sense amplifier driving circuit drives the common source power lines PCS and NCS, the sense amplifier units arranged along the source power lines amplify a voltage difference between the pair of bit lines.

Each sense amplifier driving circuit includes an N channel MOS transistor 231, a P channel MOS transistor 235, and an EQCS unit 219.

The N channel MOS transistor 231 has a gate terminal for receiving a signal RSAENT, a source terminal connected to a VSSSA power line, and a drain terminal connected to the source power line NCS. The N channel MOS transistor 231 drives the common source power line NCS of the N channel MOS transistors in each of the sense amplifier units 221a and 221b.

The P channel MOS transistor 235 has a gate terminal for receiving a signal RSAEPB, a source terminal connected to a VDDDSA power line, and a drain terminal connected to the source power line PCS. The P channel MOS transistor 235 drives the common source power line PCS of the P channel MOS transistors in each of the sense amplifier units 221a and 221b. The X decoder and X timing generation circuit 12 in FIG. 1 outputs the signals RSAENT and RSAEPB to the sense amplifier driving circuit after a predetermined time lapses from a time when the word line WL reaches an H level.

Each EQCS unit 219 includes a plurality of N channel MOS transistors. The EQCS unit 219 is a circuit for equalizing potentials of the source power lines PCS and NCS and precharging the source power lines PCS and NCS to the same potential (e.g., a precharge potential of the bit line) when the DRAM is in a precharge state.

Hereinafter, the sense amplifier units 221a or the sense amplifier units 221b and the sense amplifier driving circuit are defined as a "sense amplifier array."

The VSSSA and VDDSA power lines for supplying power to the sense amplifier array are power lines to which voltages are supplied from the outside of the DRAM via a VSSSA pad 241 and a VDDSA pad 242, respectively. Alternatively, the VDDSA power line may be connected to an output terminal of a circuit for generating an array potential that is a final write potential at a high level side of the memory cell MC (e.g. a power supply voltage dropping circuit), and a power supply voltage from such a circuit and a voltage from the outside of the DRAM via a pad connected to the power supply voltage may be supplied to the VDDSA power line.

In a DRAM operation, the memory mat 211a and the sense amplifier array shown in FIG. 2 perform the following operations.

In an initial state (the word line WL is not yet selected), the memory mats 211a to 211c and the sense amplifier arrays are in a precharge state. In the memory mats 211a to 211c, each balancer unit 223s precharges the bit line pair to a predetermined potential, for example, a middle potential between a voltage level of the VSSSA power line and a voltage level of the VDDSA power line when a control signal BLEQT0, BLEQT1 or BLEQT2 input to the gate is in an H voltage level.

The EQCS unit 219 precharges the source power line PCS and the source power line NCS to a predetermined potential, for example, a middle potential between the voltage level of the VSSSA power line and the voltage level of the VDDSA power line when a control signal EQCS input to the gate is in an H voltage level.

In each of the memory mats 211a to 211c, the transfer unit 222 connects the sense amplifier unit 221a or 221b to the bit lines BLT and BLB in the memory mat 211a and the memory mat 211b or the memory mat 211a and the memory mat 211c when a control signal SHRB0, SHRB1 or SHRB2 input to the gate is in an H voltage level. The X decoder and X timing generation circuit 12 in FIG. 1 changes a logic level of each control signal before or after a time when the word line WL reaches an H level.

The precharge state is terminated before the word line WL is activated to an H level. That is, the balancer unit 223 in the memory mat 211a terminates the precharge of each bit line pair when the voltage level of the control signal BLEQT02 input to the gate reaches an L level. Further, the EQCS unit 219 terminates the precharge of the source power lines PCS and NCS when the voltage level of the control signal EQCS input to the gate reaches an L level.

In the memory mats 211b and 211c, the transfer units 222 disconnect the sense amplifier unit 221a from the bit lines BLT and BLB in the memory mat 211b or the sense amplifier unit 221b from the bit lines BLT and BLB in the memory mat 211c when the voltage level of the control signal SHRB1 or SHRB2 input to the gate reaches an L level.

When the control circuit 113a controlled by the X decoder and X timing generation circuit 12X activates the word line WL to be in an H level, each selection transistor MS is turned on and the information storage capacitor CS is connected with the bit line BLT, such that voltage difference is generated between the bit lines in the pair (between BLT and BLB). Then, in the sense amplifier driving circuit, the RSAENT signal reaches an H level to turn the N channel MOS transistor 231 on and the RSAEPB signal reaches an L level to turn the P channel MOS transistor 235 on, such that all the sense amplifier units 221a and 221b are driven via the source power line PCS and the source power line NCS to amplify the voltage difference between the pair of bit lines in the memory mat 211a.

In a read operation of the DRAM, when a potential difference between the pair of bit lines reaches a predetermined potential after amplification, the Y selection signals YS0 and YS1 output by the Y decoder and Y timing generation circuit unit reach an H level. When the Y selection signals YS0 and YS1 are in the H level, transistors in the Y switch unit 225 are turned on to connect the bit line pair to the IO line 224, such that data in the memory cell is transferred to a data latch circuit (the data latch circuit 15 in FIG. 1) outside the memory mat.

In all operations, in which the word line WL is selected, including the refresh operation, the sense amplifier unit changes the voltage level of the bit line BLT into one of a voltage level of the VSSSA power line (L level) and a voltage level of the VDDSA power line (H level), and changes the voltage level of the bit line BLB into the other voltage level. Accordingly, a voltage level of the information storage capacitor CS reaches the H level or the L level.

In the present embodiment, the number of the banks of the DRAM is 8 and the above-described operation is performed in the two memory mat and sense amplifier arrays of each of the eight banks in the refresh operation, such that current is not concentrated on the power electrode pads (i.e., the VSSSA and VDDSA pads) for the sense amplifiers. Therefore, the refresh is performed so that the different power electrode pads are related to the amplification operation in the sense amplifier array of each bank, as described below. When there are banks using the same power electrode pad, refresh is performed so that refresh activation timing of each bank is delayed.

Figure 3:
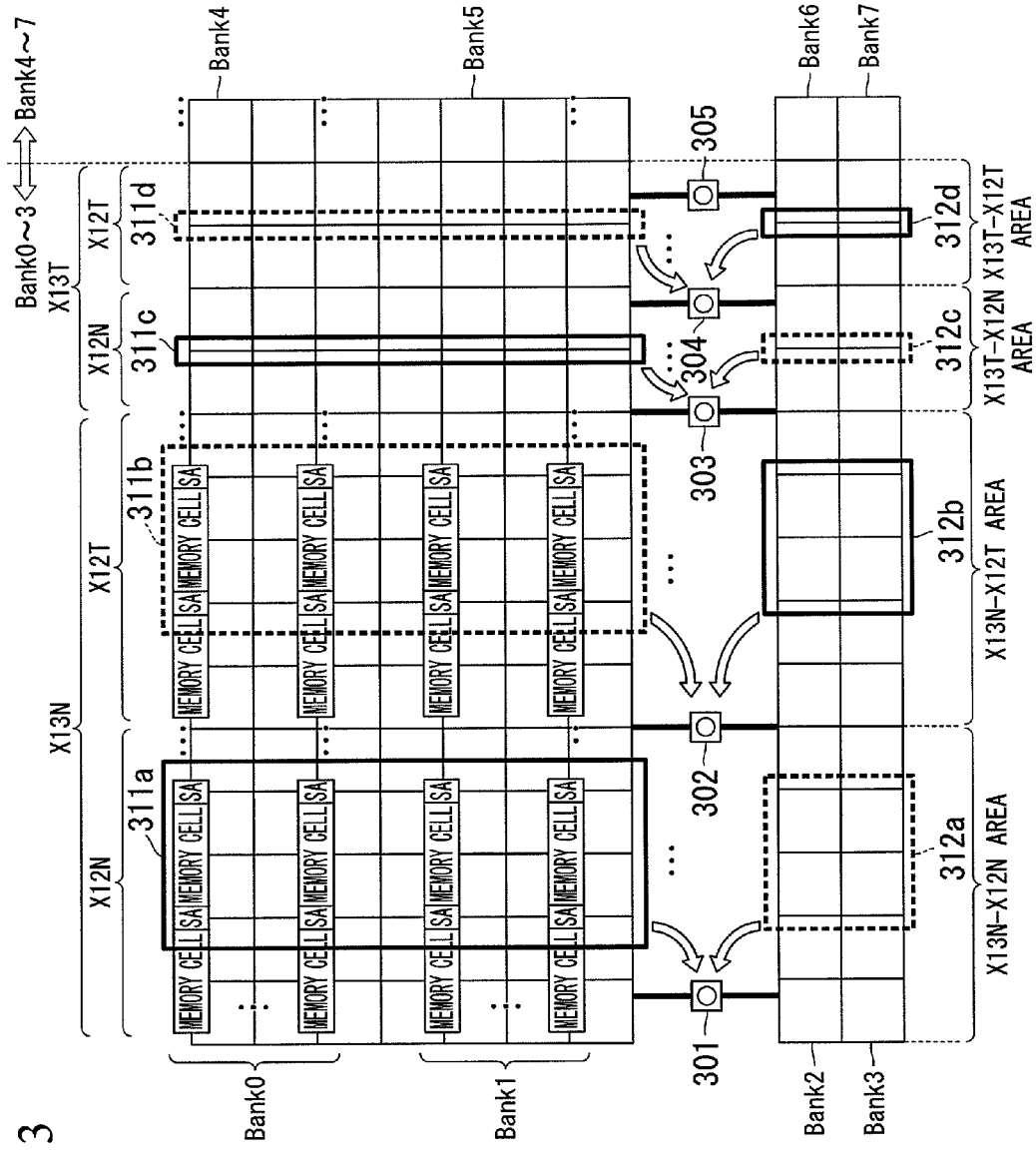
FIG. 3 is a schematic view illustrating a layout of banks in the DRAM of FIG. 1.

FIG. 3 is a conceptual diagram showing the layout of banks of a 1-Gbit DRAM in the present embodiment. A memory mat in which word lines are selected in a refresh operation (hereinafter, referred to as an activated MAT) and a sense amplifier array are shown. In FIG. 3, since Bank4 to Bank7 have the same configurations as Bank0 to Bank3, details thereof are omitted. In FIG. 3, a word line in each bank is activated by an X decoder and an X control circuit that are not shown. The X decoder receives X address signals X0T to X13T and their logically inverted signals X0N to X13N, and activates the word line according to logic levels of the signals.

That is, a word line determined by a logic level of the 14-bit X address signal is activated. Hereinafter, an arbitrary X address signal input to the X decoder is indicated by Xi (i=0 to 13) without T/B. When a logic level of the X address X is "0," a logic level of the X address signal XiT becomes "0" and a logic level of the address signal XiN becomes "1." When the logic level of the X address Xi is "1," the logic level of the address signal XiT becomes "1" and the logic level of the address signal XiN becomes "0."

Each bank in FIG. 3 is divided into four areas (each including a plurality of memory mats) according to a logic level of the X address signal X13 and a logic level of the X address signal X12. First, each bank is divided into two areas according to a logic level of the primary X address signal X13. That is, each bank is divided into an area in which one word line is activated by logic levels of X address signals X0-X12 when the logic level of the X address signal X13 is 0 (defined as an X13N area), and an area in which one word line is activated by logic levels of X address signals X0-X12 when the logic level of the X address signal X13 is 1 (defined as an X13T area).

Each of the X13N area and the X13T area is additionally divided into two areas according to the logic level of the X address signal X12. That is, each area is divided into an area in which one word line is activated by logic levels of the X address signals X0-X11 when the logic level of the X address signal X12 is 0 (defined as an X12N area), and an area in which one word line is activated by logic levels of the X address signals X0-X11 when the logic level of the X address signal X12 is 1 (defined as an X12T area).

Hereinafter, the divided areas in FIG. 3 are defined as an X13N-X12N area, an X13N-X12T area, an X13T-X12N area and an X13T-X12T area. Between Bank0 and Bank1 and Bank2 and Bank3, a VSSSA pad 301 is provided in a left area of the X13N-X12N area, a VSSSA pad 302, a VSSSA pad 303 and a VSSSA pad 304 at boundaries between the areas from a left, and a VSSSA pad 305 in a right area of the X13T-X12T area.

In FIG. 3, 16k word lines are provided in each bank. Among the word lines, word lines corresponding to logic levels of the X address signals X0 to X12 all being 1 are activated in one refresh operation (a refresh operation in a refresh cycle tRFC). That is, two word lines corresponding to one of 213 (=8k) combinations of the logic levels of the X address signals X0 to X12 are activated irrespective of the logic level of the X address signal X13.

That is, in each bank, two word lines in the X12N area (one in the X13N-X12N area and one in the X13T-X12N area) are activated or two word lines in the X12T area (one in the X13N-X12T area and one in the X13T-X12T area) are activated. In the refresh operation, a refresh cycle, in which 16k memory cells in each bank are refreshed, is repeated 8k times while changing the logic levels of the X address signals X0 to X12 to refresh all the memory cells.

The word lines activated when the logic levels of the X address signals X0 to X12 are changed are alternately selected between the X12N area and the X12T area. That is, when two word lines in the X12N area in each bank are activated in a refresh cycle using the X address signal X12 as the least significant address in the refresh operation, two word lines in the X12T area are activated in a next refresh cycle.

In FIG. 3, "activated MAT and sense amplifier arrays" activated in the first refresh cycle are surrounded by solid lines and shown as activated MAT and sense amplifier arrays 311a, 312b, 311c, and 312d. "Activated MAT and sense amplifier arrays" activated in the second refresh cycle that follows are surrounded by dotted lines and shown as activated MAT and sense amplifier arrays 312a, 311b, 312c, and 311d.

That is, when one word line in the X13N-X12N area and one word line in the X13T-X12N area of Bank0 and Bank1 are selected in the first refresh cycle, the word lines in the X13N-X12N area and the X13T-X12N area of Bank2 and Bank3 are not selected, and one word line in the X13N-X12T area and one word line in the X13T-X12T area are selected.

When one word line in the X13N-X12T area and one word line in the X13T-X12T area of Bank0 and Bank1 are selected in the second refresh cycle, the word lines in the X13N-X12T area and the X13T-X12T area of Bank2 and Bank3 are not selected and one word line in the X13N-X12N area and one word line the X13T-X12N area are selected.

Such an operation is realized by inverting the logic level of the X address signal X12 of any one of the X address signals X0 to X13 input to the X decoder and X control circuit of Bank0 and Bank1 and the X address signals X0 to X13 input to the X decoder and X control circuit of Bank2 and Bank3 in the refresh cycle. This is performed by a refresh circuit that will be described below.

In FIG. 3, a VSSSA pad of the activated MAT and sense amplifier array 311a is the VSSSA pad 301, a VSSSA pad of the activated MAT and sense amplifier array 312b is the VSSSA pad 302, a VSSSA pad of the activated MAT and sense amplifier array 311c is the VSSSA pad 303, and a VSSSA pad of the activated MAT and sense amplifier array 312d is the VSSSA pad 304.

Further, a VSSSA pad of the activated MAT and sense amplifier array 312a is the VSSSA pad 301, a VSSSA pad of the activated MAT and sense amplifier array 311b is the VSSSA pad 302, a VSSSA pad of the activated MAT and sense amplifier array 312c is the VSSSA pad 303, and a VSSSA pad of the activated MAT and sense amplifier array 311d is the VSSSA pad 304.

This configuration enables the sense current in Bank0 and Bank1 and the sense current in Bank2 and Bank3 to flow to the separate VSSSA pads in the refresh cycle, thereby mitigating current concentration.

Figure 4:
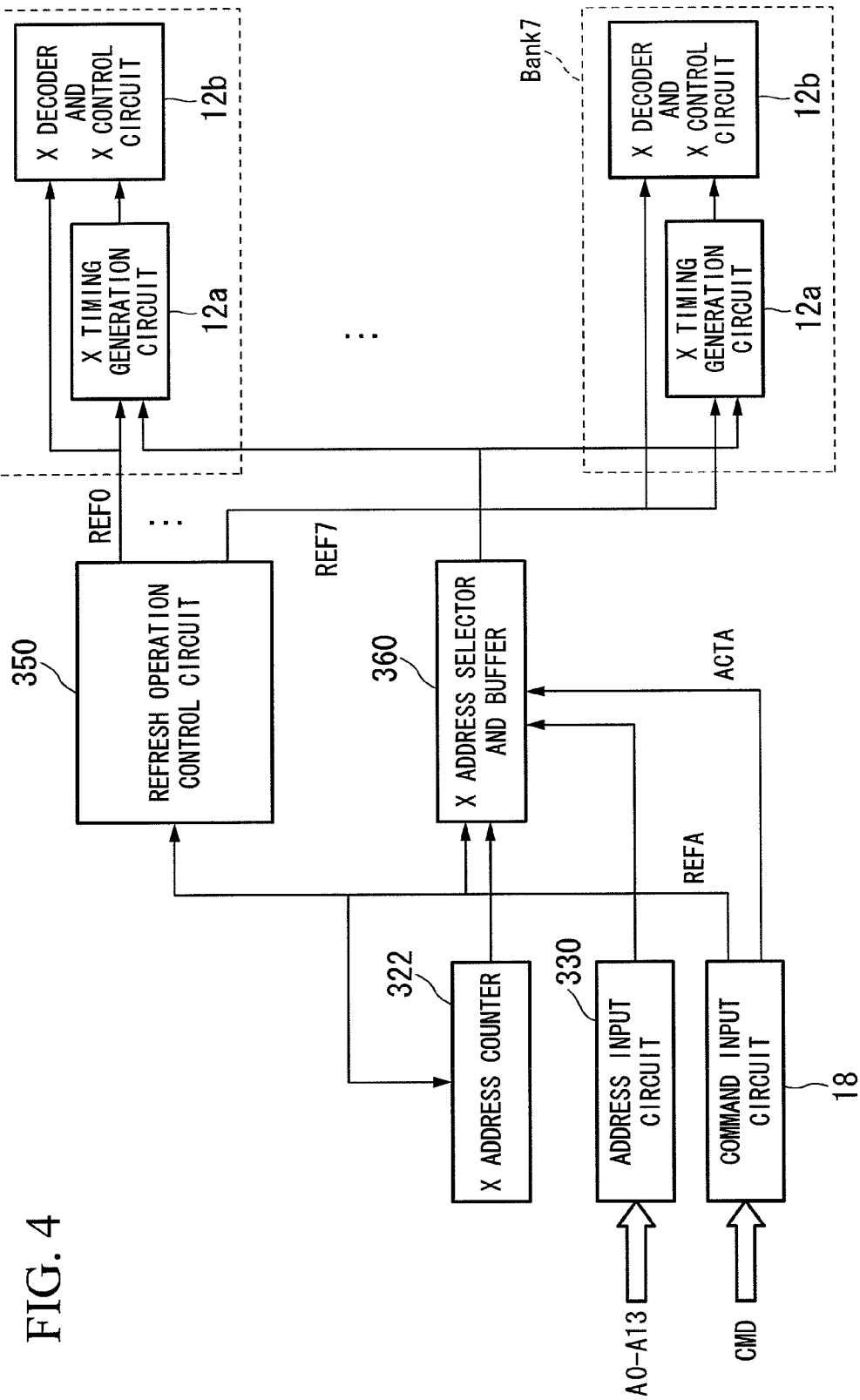
FIG. 4 is a block diagram illustrating a refresh control circuit in the DRAM of FIG. 1.

FIG. 4 is a diagram showing a refresh circuit for performing the refresh operation, and a control circuit for controlling the refresh circuit.

Since the present invention relates to the refresh operation, only a portion related to the refresh operation is extracted, as the refresh circuit, from FIG. 1. A control signal and refresh control will be described with reference to FIG. 4. The refresh circuit shown in FIG. 4 includes an X address counter 322, an address input circuit 330, a command input circuit 18, a refresh operation control circuit 350, and an X address selector and buffer 360. Further, eight banks controlled by the refresh circuit will be described as Bank0 to Bank7.

When a command CMD is input from an external DRAM controller, the command input circuit 18 decodes the input command CMD. When the decoded command CMD is a refresh command, the command input circuit 18 outputs a refresh command signal REFA, which is a signal indicating refresh execution, to the refresh operation control circuit 350, the X address counter 322, and the X address selector and buffer 360.

When an ACT command is input as a command CMD, the command input circuit 18 outputs to the X address selector and buffer 360 a signal ACTA, which is a signal indicating selection of addresses A0 to A13 input from the outside via the address input circuit 330, as addresses input to the DRAM.

When the refresh command signal REFA is input, the refresh operation control circuit 350 outputs refresh control signals REF0 to REF7 as control signals for refresh execution to banks Bank0 to Bank7. When the refresh command signal REFA is input once, the refresh operation control circuit 350 outputs the refresh control signals REF0 to REF7 to the eight memory banks once. The refresh operation control circuit 350 generates the refresh control signals REF0 to REF7 corresponding to the banks Bank0 to Bank7 at different times.

Specifically, the refresh operation control circuit 350 generates the refresh control signals REF0 and REF7, generates the refresh control signals REF3 and REF4 after an internal tRRD lapses, generates the refresh control signals REF1 and REF6 after another internal tRRD lapses, and generates the refresh control signals REF2 and REF5 after another internal tRRD lapses. For example, the internal tRRD is a delay generated using a delay circuit and a DLL circuit in the memory device.

Each time the refresh command Signal REFA is input, the X address counter 322 increments a value of an X address XADD by 1. In this case, in the X address counter, an address bit for the refresh corresponding to the address A12 becomes the lowest bit, and a next bit to the highest bit corresponds to, for example, addresses A0 to A11. When the refresh is performed, addresses of selected word lines in the banks Bank0 to Bank7 are determined by an X timing generation circuit 12a, which will be described below, based on the X address XADD that is an X address value held by the X address counter 322, and word lines corresponding to addresses determined by an X decoder and X control circuit 12b are activated.

The X address selector and buffer 360 has a function of selecting and outputting one address from among addresses A0 to A13 input from the outside via the address input circuit 330 and the X address XADD output by the X address counter 322. When the refresh command signal REFA is input, the X address selector and buffer 360 selects the X address XADD output by the X address counter 322 and outputs the selected X address XADD to the X timing generation circuit 12a of each memory bank.

In FIG. 4, Bank0 to Bank7 refresh their cells while delaying a word line activation time output from the X decoder and X control circuit based on the X address XADD and the refresh control signals REF0 to REF7 input to the X timing generation circuits 12a.

Here, when the refresh control signals REF0 to REF7 are input, the X timing generation circuits 12a in Bank0 to Bank7 generate an X address signal X13T and an X address signal X13N each having a logic level of "1" whether a logic level of an address signal corresponding to the address A13 of the X address XADD is "0" or "1." Each X timing generation circuit 12a outputs the X address signal X13T and the X address signal X13N to the X decoder and X control circuit 12b.

When the refresh control signals REF0, REF1, REF6, and REF7 are input, the X timing generation circuits 12a in Bank0, Bank1, Bank6 and Bank7 generate an X address signal X12T without changing a logic level of an address signal corresponding to the address A12 of the X address XADD. The X timing generation circuits 12a invert the logic level of the X address signal X12T to generate an X address signal X12N. The X timing generation circuits 12a output the X address signal X12T and the X address signal X12N to the X decoder and X control circuits 12b.

Meanwhile, when the refresh control signals REF2, REF3, REF4, and REF5 are input, the X timing generation circuits 12a in Bank2, Bank3, Bank4 and Bank5 invert a logic level of an address signal corresponding to the address A12 of the X address XADD to generate an X address signal X12T. The X timing generation circuits 12a also invert the logic level of the X address signal X12T to generate an X address signal X12N. The X timing generation circuits 12a output the X address signal X12T and the X address signal X12N to the X decoder and X control circuits 12b.

When the refresh control signals REF0 to REF7 are input, the X timing generation circuits 12a in Bank0 to Bank7 generate X address signals X0T to X11T without changing logic levels of address signals corresponding to the addresses A0 to A11 of the X address XADD. The X timing generation circuits 12a invert logic levels of the X address signals X0T to X11T to generate X address signals X0N to X11N. The X timing generation circuits 12a output the X address signals X0T to X11T and the X address signals X0N to X11N to the X decoder and X control circuits 12b.

The layout of the VSSSA pads and the configuration of the refresh circuit as described above enable Bank0 to Bank7 of the DRAM in the present embodiment to perform a refresh operation described below with reference to FIGS. 5 and 6A.

Figure 5:
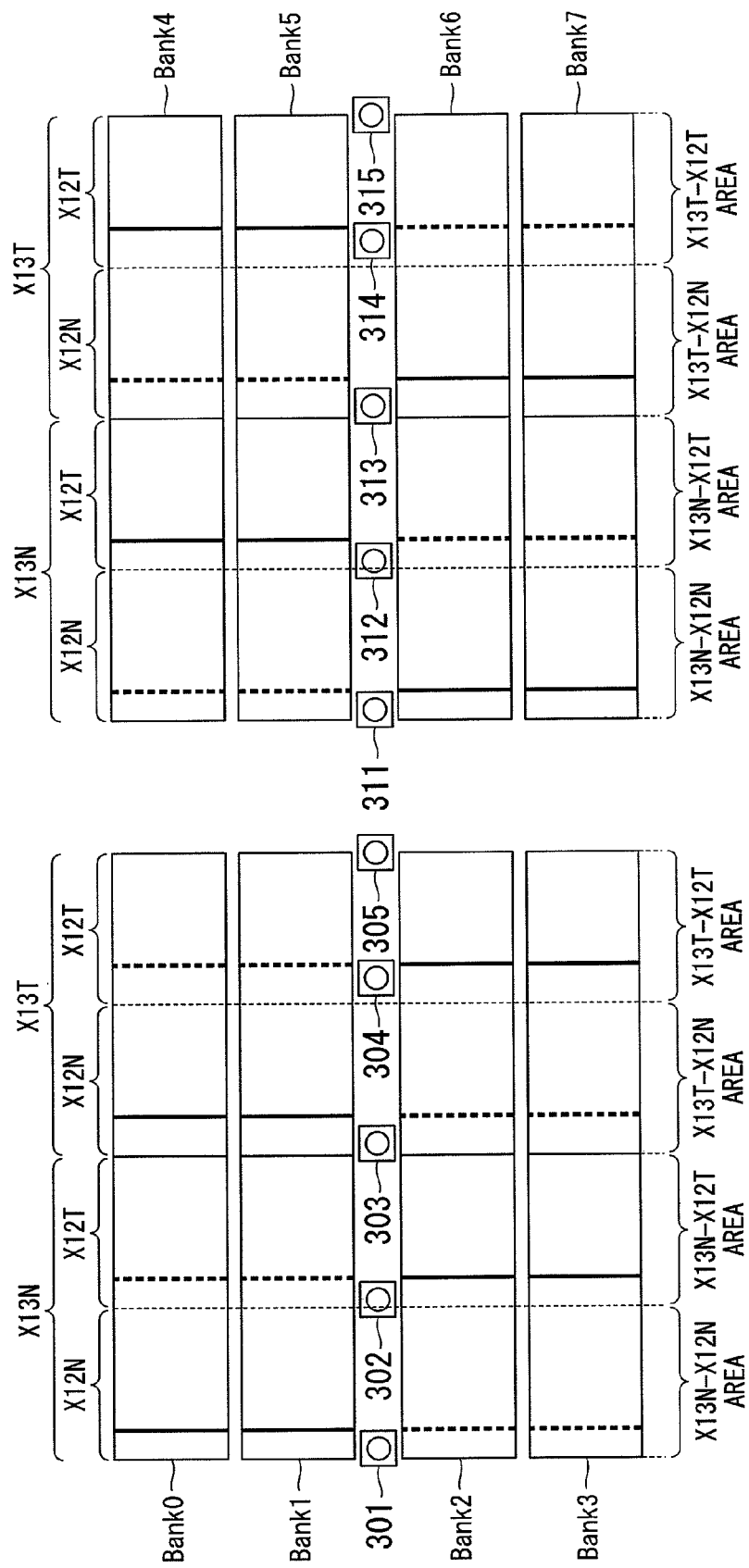
FIG. 5 is a schematic view illustrating a layout of banks in the DRAM of FIG. 1.

FIG. 5 is a conceptual diagram showing the layout of banks in a 1-Gbit DRAM. Word lines selected in a refresh operation are indicated by solid lines and dotted lines. FIG. 6A is a timing chart showing control of the word line selection in FIG. 5 on a time axis.

In FIG. 5, the word line in each bank is activated by the X decoder and X control circuit. The X decoder and X control circuit activates the word line according to logic levels of input X address signals X0T to X13T and their logically inverted signals X0N to X13N.

That is, the word line determined by the logic level of the 14-bit X address signal is activated. Each bank in FIG. 5 is divided into an area in which one word line is activated by logic levels of the other X address signals X0-X12 when the logic level of the X address signal X13 is 0 (defined as an X13N area), and an area in which one word line is activated by logic levels of the other X address signals X0-X12 when the logic level of the X address signal X13 is 1 (defined as an X13T area), as in FIG. 3.

Each of the X13N area and the X13T area is divided into an area in which one word line is activated by the logic levels of the other X address signals X0-X11 when the logic level of the X address signal X12 is 0 (defined as an X12N area), and an area in which one word line is activated by the logic levels of the other X address signals X0-X11 when the logic level of the X address signal X12 is 1 (defined as an X12T area). Hereinafter, the divided areas in FIG. 5 are defined as an X13N-X12N area, an X13N-X12T area, an X13T-X12N area, and an X13T-X12T area, as in FIG. 3.

In FIG. 5, 16k word lines are provided in each bank. Among the word lines, word lines corresponding to the logic levels of the X address signals X0 to X12 all being 1 are activated in one refresh operation (a refresh operation in a refresh cycle tRFC). That is, two word lines corresponding to one of 213 (=8k) combinations of the logic levels of the X address signals X0 to X12 are activated irrespective of the logic level of the X address signal X13.

That is, two word lines in the X12N area (one in the X13N-X12N area and one in the X13T-X12N area) are activated or two word lines in the X12T area (one in the X13N-X12T area and one in the X13T-X12T area) are activated. In the refresh operation, a refresh cycle, in which 16k memory cells in each bank are refreshed, is repeated 8k times while changing the logic levels of the X address signals X0 to X12 to refresh all the memory cells.

The word lines activated when the logic levels of the X address signals X0 to X12 are changed are alternately selected between the X12N area and the X12T area. That is, since the X address signal X12 is the least significant address in the refresh operation as described above, the two word lines in the X12N area are activated in a refresh cycle and two word lines in the X12T area are activated in a next refresh cycle. In FIG. 5, word lines activated in the first refresh cycle are indicated by solid lines as "first REF activation sites," and word lines activated in the second refresh cycle are indicated by dotted lines as "second REF activation sites."

As the X timing generation circuit 12a in the refresh circuit is configured as described above, VSSSA pads of a word line activation site ("the first REF activation site") and the "activated MAT and sense amplifier array" in the first refresh cycle are as follows. In the following description, it is assumed that the word line activation site is a site in the memory mat where the word line is selected.

The "first REF activation sites" in Bank0, Bank1, Bank6 and Bank7 are the X13N-X12N area and the X13T-X12N area. Further, the "first REF activation sites" in Bank2, Bank3, Bank4 and Bank5 are the X13N-X12T area and the X13T-X12T area.

VSSSA pads in Bank0 and Bank1 are VSSSA pads 301 and 303, and VSSSA pads in Bank2 and Bank3 are VSSSA pads 302 and 304.

VSSSA pads in Bank4 and Bank5 are VSSSA pads 312 and 314, and VSSSA pads in Bank5 and Bank6 are VSSSA pads 311 and 313.

Meanwhile, a word line activation site ("the second REF activation site") and VSSSA pads of the "activated MAT and sense amplifier array" in the second refresh cycle are as follows.

The "second REF activation sites" in Bank0, Bank1, Bank6 and Bank7 are the X13N-X12T area and the X13T-X12T area, and the "second REF activation sites" in Bank2, Bank3, Bank4 and Bank5 are the X13N-X12N area and the X13T-X12N area.

VSSSA pads in Bank0 and Bank1 are the VSSSA pads 302 and 304, and VSSSA pads in Bank2 and Bank3 are the VSSSA pads 301 and 303.

VSSSA pads in Bank4 and Bank5 are the VSSSA pads 311 and 313, and VSSSA pads in Bank5 and Bank6 are the VSSSA pads 312 and 314.

That is, as the VSSSA pads are provided at boundaries between the X12N areas and the X12T areas, the VSSSA pads of Bank2 and Bank3 differ from the VSSSA pads of Bank0 and Bank1. Further, the VSSSA pads of Bank6 and Bank7 differ from VSSSA pads of Bank4 and Bank5. In the related art, sense currents of four banks are concentrated on and flow to a VSSSA pad. On the other hand, in the present embodiment, sense amplifier currents of two banks flow to the VSSSA pad, thereby suppressing the current concentration.

The current concentration can also be suppressed by changing a word line activation time of each bank to delay a current concentrating time as described below.

Figure 6A:
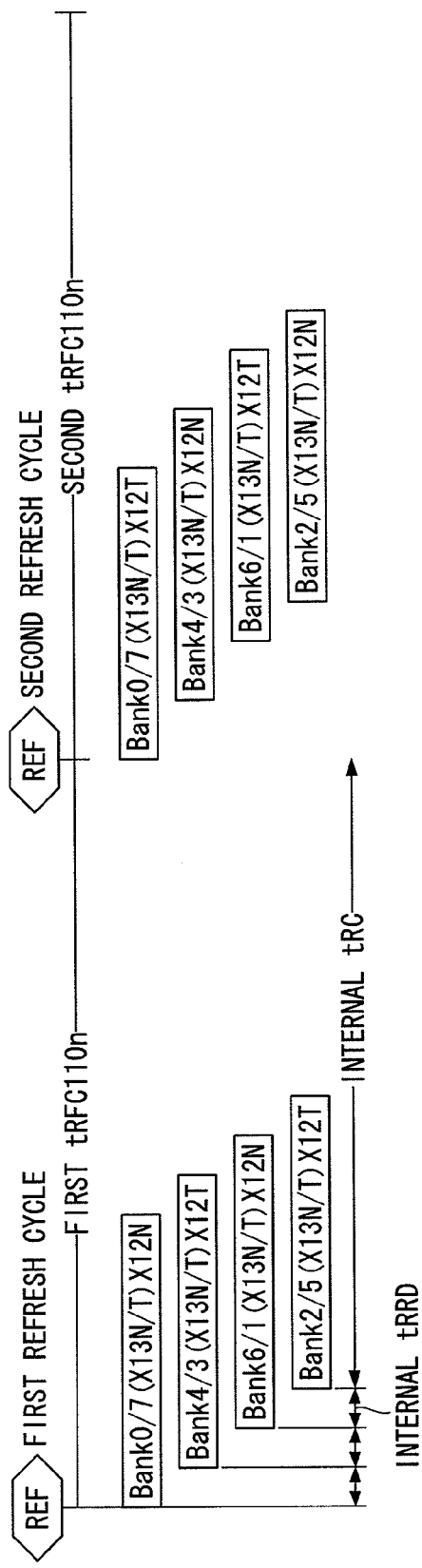
FIG. 6A is a timing chart illustrating a method of controlling refresh operations of the DRAM of FIG. 1.

In FIG. 6A, tRFC indicates a time of a refresh cycle. For example, tRFC is defined as 110 nanoseconds (ns) in a specification of a product. Internal tRRD is a delay time between bank activation times. The internal tRRD is set in a memory device. An internal tRC is a time from a word line activation time to a time when the refresh of the memory cell is terminated and the potential of the memory cell is restored to a ground potential (equal to VSSSA) or a power supply voltage (VDDDSA). The internal tRC is set in the memory device.

As shown in FIG. 6A, in any of the first refresh cycle and the second refresh cycle, refresh of Bank0 and Bank7 is initiated, and then refresh of Bank3 and Bank4 is initiated after internal tRRD lapses. Refresh of Bank1 and Bank6 is initiated after another internal tRRD lapses from the refresh initiation in Bank3 and Bank4, and then refresh of Bank2 and Bank5 is initiated after another internal tRRD lapses.

That is, when the refresh is performed, two banks are combined into one, and the refresh is controlled to be performed while delaying the internal tRRD among four obtained bank combinations. This is because a restore level of the memory cell is guaranteed and a tRFC standard is satisfied, as described above.

The four combinations of the two of the eight banks, such as Bank0 and Bank7, Bank3 and Bank4, Bank1 and Bank6, and Bank2 and Bank5, and the bank activation in this order are intended to make the VSSSA pads in the simultaneously activated banks different and to prevent the banks at the same side with respect to the VSSSA pads from being continuously activated.

As shown in FIG. 5, in the first refresh cycle, VSSSA pads of Bank0 and Bank7 are VSSSA pads 301 and 303 and VSSSA pads 311 and 313, respectively.

VSSSA pads of Bank3 and Bank4 activated after the internal tRRD lapses are VSSSA pads 302 and 304 and VSSSA pads 312 and 314, respectively.

That is, current does not flow to the same VSSSA pad before and after the first internal tRRD lapses. VSSSA pads of Bank1 and Bank6 activated after twice the internal tRRD lapses are the VSSSA pads 301 and 303 and the VSSSA pads 311 and 313, respectively.

These VSSSA pads are different from those of Bank3 and Bank4 activated before the internal tRRD lapses and are the same as those of Bank0 and Bank7 activated first. In other words, Bank1 and Bank6 are activated after twice the internal tRRD2 lapses from the activation time of Bank0 and Bank7, that is, can be activated when rise of the potential of the VSSSA pads is resolved (after the potential drops from a maximum peak potential).

VSSSA pads of Bank2 and Bank5 activated after three times the internal tRRD lapses, that is, activated last, are the VSSSA pads 302 and 304 and the VSSSA pads 312 and 314, respectively.

These VSSSA pads are different from those of Bank1 and Bank6 activated before the internal tRRD lapses and are the same as those of Bank3 and Bank4 activated second. In other words, Bank2 and Bank5 are activated after twice the internal tRRD2 lapses from the activation time of Bank3 and Bank4, that is, can be activated when the potential of the VSSSA pad returns to a potential before the activation, that is, when the rise of the potential is resolved.

Thus, the semiconductor memory device according to the present embodiment includes a plurality of banks (Bank0 to Bank7) in which a plurality of memory mats (e.g., the X13N-X12N area) and sense amplifier arrays are provided corresponding to row addresses (the X address signals X0 to X13), characterized in that the plurality of banks (Bank0 to Bank7) are divided into a plurality of sets (four sets: Bank0 and Bank1, Bank2 and Bank3 and Bank4 and Bank5, and Bank6 and Bank7), the plurality of sets are disposed at both sides of a plurality of power electrode pads (e.g., the VSSSA pads 301 and 302) related to an amplification operation in the sense amplifier arrays to share the power electrode pads, and each bank includes an address control unit (i.e., the X timing generation circuit 12a) for outputting a row address for selecting one memory mat in the set and a row address for selecting the other memory mat in the set, i.e. different row addresses (the X address signals X0 to X13) to make the power electrode pads different between the sets (e.g., the VSSSA pad 301 for Bank0 and Bank1, and the VSSSA pad 302 for Bank2 and Bank3) when the refresh is performed in response to an external refresh command.

According to the semiconductor memory device of the present invention, the number of sense amplifier arrays connected to each VSSSA pad is reduced and thus the rise of the potential of the VSSSA line due to current concentration on the VSSSA pad is suppressed, unlike the related art. Thus, it is possible to improve operational margin of the sense amplifier and increase an amplification speed. Since the rise of the potential of the VSSSA line is suppressed, the internal tRRD can be set to a small value and the internal tRC of subsequently activated banks can be increased. Thus, it is also possible to improve the restore level of the memory cell.

Figure 6B:
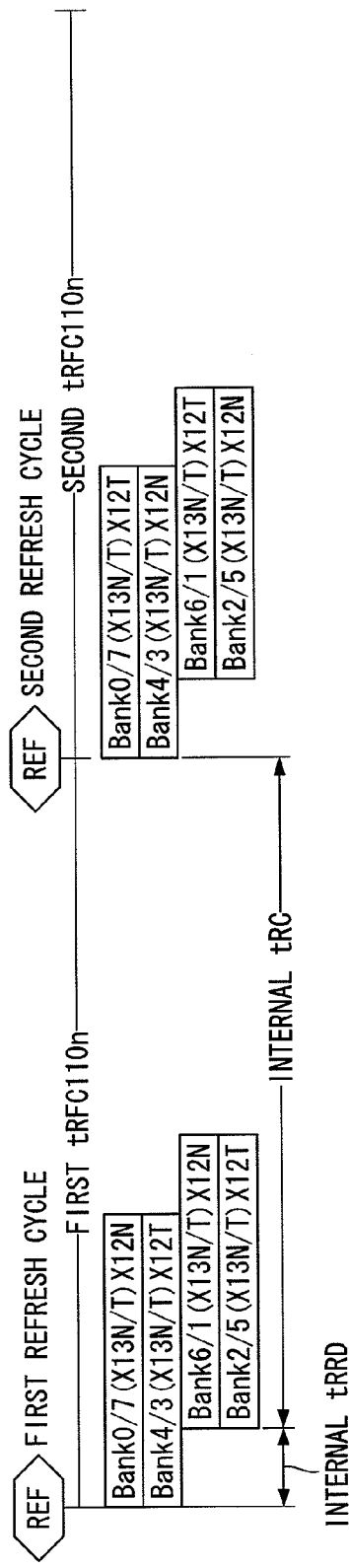
FIG. 6B is a timing chart illustrating another method of controlling refresh operations of the DRAM of FIG. 1.

FIG. 6B is a timing chart of another embodiment in which the bank activation time is changed.

As shown in FIG. 6B, even in any of the first refresh cycle or the second refresh cycle, refresh of a combination of Bank0, Bank7, Bank3 and Bank4 is initiated, and then refresh of a combination of Bank3, Bank4, Bank1 and Bank6 is initiated after an internal tRRD lapses. That is, four banks are combined into one, and two obtained combinations are controlled to be refreshed through delay using the internal tRRD.

This control is realized by changing a generation time of the refresh control signals REF0 to REF7 in the refresh operation control circuit 350 in FIG. 4. Specifically, when the refresh command signal REFA is input once, the refresh operation control circuit 350 generates the refresh control signals REF0, REF3, REF4 and REF7. Then, the refresh operation control circuit 350 generates the refresh control signals REF1, REF2, REF5 and REF6 after the internal tRRD lapses. The refresh operation control circuit 350 outputs the refresh control signals REF0 to REF7, which are control signals for refresh execution, to the banks Bank0 to Bank7.

In each of the banks to which the refresh control signals are input, in the first refresh cycle, the VSSSA pads of Bank0 are the VSSSA pads 301 and 303, as shown in FIG. 5. The VSSSA pads of Bank7 are the VSSSA pads 311 and 313. The VSSSA pads of Bank3 are the VSSSA pads 302 and 304. The VSSSA pads of Bank4 are the VSSSA pads 312 and 314.

The VSSSA pads of Bank1 activated after the internal tRRD lapses are the VSSSA pads 301 and 303. The VSSSA pads of Bank6 are the VSSSA pads 311 and 313. The VSSSA pads of Bank2 are the VSSSA pads 302 and 304. The VSSSA pads of Bank5 are the VSSSA pads 312 and 314.

Thus, the semiconductor memory device according to the present embodiment includes a plurality of banks (Bank0 to Bank7) in which a plurality of memory mats (e.g., the X13N-X12N area) and sense amplifier arrays are provided corresponding to row addresses (the X address signals X0 to X13), characterized in that the plurality of banks (Bank0 to Bank7) are divided into a plurality of sets (4 sets: Bank0 and Bank1, Bank2 and Bank3, Bank4 and Bank5, and Bank6 and Bank7), the sets are disposed at both sides of a plurality of power electrode pads (e.g., the VSSSA pads 301 and 302) related to the amplification operation in the sense amplifier arrays to share the power electrode pads, and each bank includes an address control unit (i.e., the X timing generation circuit 12a) for outputting a row address for selecting one memory mat in the set and a row address for selecting the other memory mat in the set, i.e. different row addresses (the X address signals X0 to X13) to make the power electrode pads different between the sets (e.g., the VSSSA pad 301 for Bank0 and Bank1, and the VSSSA pad 302 for Bank2 and Bank3) when the refresh is performed in response to an external refresh command.

The semiconductor memory device is also characterized in that the memory mat and the sense amplifier array are provided corresponding to the least significant address (the X address signal X12) in the refresh operation, and the address control unit (the X timing generation circuit 12a) inverts the logic level of the least significant address (the X address signal X12) in one bank of the set when the refresh is performed.

The semiconductor memory device is also characterized in that, when there are a plurality of banks using the same power electrode pad (e.g., Bank0 and Bank1) in the set, the refresh activation timing for each bank is delayed.

The semiconductor memory device is also characterized in that the sets include a first set including the first bank (Bank0) and the second bank (Bank1), a second set including the third bank (Bank2) and the fourth bank (Bank3), a third set including the fifth bank (Bank4) and the sixth bank (Bank5), and a fourth set including the seventh bank (Bank6) and the eighth bank (Bank7), the first and second sets share the power electrode pads (e.g., the VSSSA pads 301 and 302), the third and fourth sets share the power electrode pad (e.g., the VSSSA pads 311 and 312), and when the refresh is performed in response to the external refresh command, the first bank (Bank0), the fourth bank (Bank3), the fifth bank (Bank4) and the eighth bank (Bank7) are first refreshed, and then the second bank (Bank1), the third bank (Bank2), the sixth bank (Banks) and the seventh bank (Bank6) are refreshed.

That is, before and after the first internal tRRD lapses, current flows to the same VSSSA pad. This is different from the first embodiment described above. However, since four banks are simultaneously activated, the number of activation time delays using the internal tRRD is reduced from three times to one time. Thus, it is possible to extend the internal tRRD without decreasing the internal tRC. For example, it is possible to set the internal tRRD to 1.5 times the internal tRRD in the first embodiment. This setting of the internal tRRD makes it possible to extend the internal tRC by 1.5 times the internal tRRD.

That is, when the internal tRRD is set to be extended to a time smaller than three times the internal tRRD in the first embodiment, the activation initiation time can be greatly delayed between first activated Bank0, Bank7, Bank3 and Bank4 and subsequently activated Bank1, Bank6, Bank2 and Bank5, and the internal tRC of the subsequently activated Bank1 and Bank6, Bank2 and Bank5 can be extended. Accordingly, when the rise of the potential of the VSSSA pad is resolved (after the potential drops from the maximum peak potential), Bank1, Bank6, Bank2 and Bank5 can be activated, and thus the sense margin can be further increased and the restore level of the cell can be further secured, unlike the first embodiment.

While the embodiments of the present invention has been described based on the embodiments, the embodiments of the present invention is not limited to the described embodiments and variations may be made to the embodiments of the present invention without departing from the spirit and scope of the embodiments of the present invention. While in the present embodiment, a total of ten VSSSA pads are used by the eight banks in FIG. 5, the X12T area and the X12N area may be divided into half areas using the X address signal X11 and VSSSA pads may be additionally provided in boundary areas. In this case, a total number of the VSSSA pads in the eight banks is 18, and the rise of the GND level due to the sense current can be suppressed.

While the improvement of the restore level of the memory cell in the refresh has been described with respect to the VSSSA pad in the sense amplifier array, the embodiments of the present invention may be applied to the VDDSA pads illustrated in FIG. 2 in light of the embodiments of the present invention intended for the restore level improvement. That is, the power electrode pads include VDDSA pads for supplying a high-voltage-side voltage, as well as VSSSA pads for supplying a low-voltage-side voltage to the sense amplifier arrays.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a plurality of bank sets, each bank set comprising a plurality of banks, each bank comprising a plurality of memory mats and sense amplifier circuits corresponding to row addresses, the plurality of bank sets being arranged at first and second sides of arrays of power electrode pads to be used for operations of the sense amplifier circuits, the plurality of bank sets commonly coupled to the arrays of power electrode pads; and
   a controller that generates different row addresses that are supplied to bank sets, to designate different memory mats disposed at the first side or the second side of the power electrode pads, in the bank sets, when a refresh operation in accordance with a refresh command is requested,
   wherein the plurality of memory mats and sense amplifier circuits correspond to the least significant addresses in refresh operation,
   the controller logically inverts the least significant address for one of the plurality of bank sets for refresh operation,
   activations for refresh operation of the plurality of banks are performed at different timings, the plurality of banks are included in the bank set and are coupled to the same array of power electrode pads, and
   the plurality of bank sets comprises first, second, third and fourth bank sets, the first and second bank sets commonly coupled to a first one of the arrays of power electrode pads, and the third and fourth bank sets commonly coupled to a second one of the arrays of power electrode pads.

2. The semiconductor device according to claim 1, wherein the first bank set comprises a first bank and a second bank, the second bank set comprises a third bank and a fourth bank, the third bank set comprises a fifth bank and a sixth bank, and the fourth bank set comprises a seventh bank and an eighth bank.

3. The semiconductor device according to claim 2, wherein the refresh operation is performed in the order of refreshing the first and eighth banks in a first refreshing process, refreshing the fourth and fifth banks in a second refreshing process, refreshing the second and seventh banks in a third refreshing process, and refreshing the third and sixth banks in a fourth refreshing process.

4. The semiconductor device according to claim 2, wherein the refresh operation is performed in the order of refreshing the first, fourth, fifth and eighth banks in a first refreshing process, and refreshing the second, third, sixth and seventh banks in a second refreshing process.

5. A semiconductor device comprising:
first and second bank sets, each bank set comprising a plurality of banks, each bank comprising a plurality of memory mats and sense amplifier circuits corresponding to row addresses, the first bank set being arranged in a first side of a first array of power electrode pads and the second bank set being arranged in a second side of the first array of power electrode pads, the first and second bank sets commonly coupled to the first array of power electrode pads;
a controller that generates first and second row addresses different from each other for the first and second bank sets respectively, the first row address designating a first memory mat of the first bank set, and the second row address designating a second memory mat of the second bank set in refresh operation in accordance with a refresh command,
wherein activations of the plurality of banks are performed at different timings,
the plurality of banks are included in the same one of the first and second bank sets and are coupled to the same power electrode pads, and
the semiconductor device further comprises:
third and fourth bank sets, each bank set comprising a plurality of banks, each bank comprising a plurality of memory mats and sense amplifier circuits corresponding to row addresses,
the third bank set being arranged in the first side of a second array of power electrode pads and the fourth bank set being arranged in the second side of the second array of power electrode pads, the third and fourth bank sets commonly sharing the second array of power electrode pads,
wherein the controller generates third and fourth row addresses for the third and fourth bank sets respectively, the third row address designating a third memory mat of the third bank set, and the fourth row address designating a fourth memory mat of the fourth bank set, so as to designate different power electrode pads of the second array of power electrode pads for the third and fourth bank sets in refresh operation in accordance with the refresh command.

6. The semiconductor device according to claim 5, wherein the first and second bank sets commonly coupled to the first array of power electrode pads, and the third and fourth bank sets commonly coupled to the second array of power electrode pads.

7. The semiconductor device according to claim 6, wherein the first bank set comprises a first bank and a second bank,
the second bank set comprises a third bank and a fourth bank, the third bank set comprises a fifth bank and a sixth bank, and
the fourth bank set comprises a seventh bank and an eighth bank.

8. The semiconductor device according to claim 7, wherein the refresh operation is performed in the order of refreshing the first and eighth banks in a first refreshing process, refreshing the fourth and fifth banks in a second refreshing process, refreshing the second and seventh banks in a third refreshing process, and refreshing the third and sixth banks in a fourth refreshing process.

9. The semiconductor device according to claim 7, wherein the refresh operation is performed in the order of refreshing the first, fourth, fifth and eighth banks in a first refreshing process, and refreshing the second, third, sixth and seventh banks in a second refreshing process.

10. A semiconductor device comprising:
a plurality of bank sets, each bank set comprising a plurality of banks, each bank comprising a plurality of memory mats and sense amplifier circuits corresponding to row addresses, the plurality of bank sets being arranged at first and second sides of arrays of power electrode pads to be used for operations of the sense amplifier circuits, the plurality of bank sets commonly coupled to the arrays of power electrode pads; and
a controller that generates different row addresses that are supplied to bank sets, to designate different memory mats disposed at the first side or the second side of the power electrode pads, in the bank sets, when a refresh operation in accordance with a refresh command is requested,
wherein the respective bank sets are disposed opposing one another and are split into areas disposed next to one another in a first direction in which the arrays of the power electrode pads extend;
the respective bank sets of a corresponding area share a respective power electrode pad;
the memory mats of each bank set extend in the first direction, across the areas; and
the different memory mats, that are being refreshed according to the generated row addresses, are disposed in different areas of the opposing bank sets in the first direction so that the memory mats, which are being refreshed, are not next to one another in the first direction.

* * * * *